US006765186B2

(12) United States Patent
Janesick

(10) Patent No.: US 6,765,186 B2
(45) Date of Patent: Jul. 20, 2004

(54) MULTI-MODE IMAGER WITH PINNED PHOTO REGION PHOTORECEPTORS

(75) Inventor: James Janesick, Huntington Beach, CA (US)

(73) Assignee: ESS Technology, Inc., Fremont, CA (US)

(*) Notice: Subject to any disclaimer, the term of this patent is extended or adjusted under 35 U.S.C. 154(b) by 238 days.

(21) Appl. No.: 10/135,708

(22) Filed: Apr. 30, 2002

(65) Prior Publication Data

US 2003/0085339 A1 May 8, 2003

(Under 37 CFR 1.47)

Related U.S. Application Data

(63) Continuation-in-part of application No. 10/035,405, filed on Nov. 8, 2001.
(51) Int. Cl.⁷ .................................................. H04N 3/14
(52) U.S. Cl. ................................ 250/208.1; 250/214.1; 348/241; 348/308
(58) Field of Search ...................... 250/208.1; 348/241, 348/243, 297, 299, 307, 308, 314

(56) References Cited

U.S. PATENT DOCUMENTS 6,166,768 A * 12/2000 Fossum et al. ............. 348/308
6,320,617 B1 * 11/2001 Gee et al. ................... 348/302
6,515,702 B1 * 2/2003 Yadid-Pecht et al. ....... 348/308

* cited by examiner

Primary Examiner—Stephone B. Allen
(74) Attorney, Agent, or Firm—Farjami & Farjami LLP

(57) ABSTRACT

An imager includes an array of imager cells coupled to a multi-mode controller. The multi-mode controller includes circuitry that implements several modes of operation, including a high-light mode, a low-light mode, and a Snap mode. The high-light mode provides charge accumulation in a photoreceptor potential well, a readout potential well, and a sense node potential well. The low-light mode provides charge accumulation in the photoreceptor potential well constrained by an integration potential well. The Snap mode of operation simultaneously transfers accumulated charge for a set of the imager cells to their sense nodes. In addition, the multi-mode controller may select one of a plurality of V+ integration voltages for setting up a selected charge capacity in one of the imager cells. Thus, the V+ integration voltage may be increased to provide charge capacity to address increased light levels. The imager thereby provides low noise characteristics and is configurable for a wide range of charge capacity, for a wide range of light levels, as compared to conventional imager cell implementations.

21 Claims, 4 Drawing Sheets

MULTI-MODE IMAGER WITH PINNED PHOTO REGION PHOTORECEPTORS

CROSS REFERENCE TO RELATED APPLICATIONS

This application is a Continuation in Part of U.S. patent application Ser. No. 10/035,405, filed Nov. 8, 2001, titled "Multi-mode Imager with Pinned Photo Region Photoreceptors".

BACKGROUND OF THE INVENTION

1. Field of the Invention

This invention relates to electronic imaging devices, and in particular to a CMOS imager incorporating a photoreceptor array and a multi-mode controller.

2. Related Art

Electronic imaging devices ("imagers") find use in a broad range of applications in many distinct fields of technology including the consumer, industrial, medical, defense and scientific fields. Imagers use an array of photoreceptors to convert photons bearing image information into electrical signals representative of the image.

In recent years, CMOS imagers have become a practical implementation option and provide cost and power advantages over other technologies (such as charge coupled devices). A conventional CMOS imager is typically structured as an array of imager cells, each of which includes a photoreceptor approximately reset to a known potential in preparation for integration and readout of an image. The performance of a CMOS imager depends heavily on the performance of the individual imager cells.

In the past, the imager cells took the form of either passive photoreceptor cells, active photoreceptor cells, or transfer gate active photoreceptor cells. The passive photoreceptor cells typically included a photodiode for collecting photocharge and a single access transistor to connect the photodiode to a readout bus. However, passive photoreceptor cells, while having high quantum efficiency, were plagued by large amounts of noise.

As a result, imagers began to incorporate active photoreceptor cells. The active photoreceptor cells included a photoreceptor, and either three or four support transistors. The support transistors included a reset transistor, source follower transistor (for buffering and amplifying the collector photocharge), and an access transistor for connecting the photoreceptor to a readout bus. In transfer gate active photoreceptor cells, a fourth transfer gate transistor was used to transfer photocharge from the photoreceptor to a sense node, thereby allowing correlated double sampling, and a corresponding decrease in noise.

During integration, a photoreceptor cell sets up a potential well that collects electrons generated by incident photons. The potential well, however, has a limited charge capacity. As a result, it was possible for bright light to generate enough electrons to substantially fill the potential well of the photoreceptors in an imager, thereby yielding a washed out image. Thus, prior photoreceptor cells were not tailored to provide adequate response over a wide range of light levels.

Furthermore, prior imagers implemented a progressive readout technique that sequentially transferred charge from a row of photoreceptors to their respective sense nodes, then through respective amplifiers to a column bus. However, while one photoreceptor row was being readout, the image information stored in the remaining photoreceptor row was susceptible to noise from the photoreceptor structure itself, as well as from additional incident photons. Thus, the image acquired by the photoreceptor array changed as the image was being readout.

A need exists for an improved imager cell that addresses the problems noted above and other previously experienced.

SUMMARY

An improved imager is arrived at by incorporating a mulit-mode controller in an imager. The imager may be broadly conceptualized as an light detector with low noise characteristics that is configurable for a wide range of charge capacity, for a wide range of light levels, as compared to conventional imager cell implementations.

The imager may be implemented as an array of imager cells coupled to a multi-mode controller. The multi-mode controller includes circuitry that implements several modes of operation, including a high-light mode, a low-light mode, and a Snap mode. As explained in more detail below, the high-light mode provides charge accumulation in a photoreceptor potential well, a readout potential well, and a sense node potential well. The low-light mode provides charge accumulation in the photoreceptor potential well and constrained by an integration potential well. The Snap mode of operation simultaneously transfers accumulated charge for a set of the imager cells to their sense nodes.

During the high-light mode, the multi-mode controller applies a V+ integration voltage during an integration period to a photoreceptor readout gate, thereby allowing charge to accumulate in the readout potential well. In addition, the multi-mode controller may select one of a plurality of V+ integration voltages for setting up a selected charge capacity in one of the imager cells. Thus, the V+ integration voltage may be increased to provide charge capacity to address increased light levels.

The imager cells may be implemented using a pinned photoreceptor, a transfer gate, a reset transistor, an access transistor, and an output amplifier. The photoreceptor may be, for example, a photodiode. Furthermore, the imager cells may include anti-reflective coatings to improve performance.

Other implementations, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Figure 1:
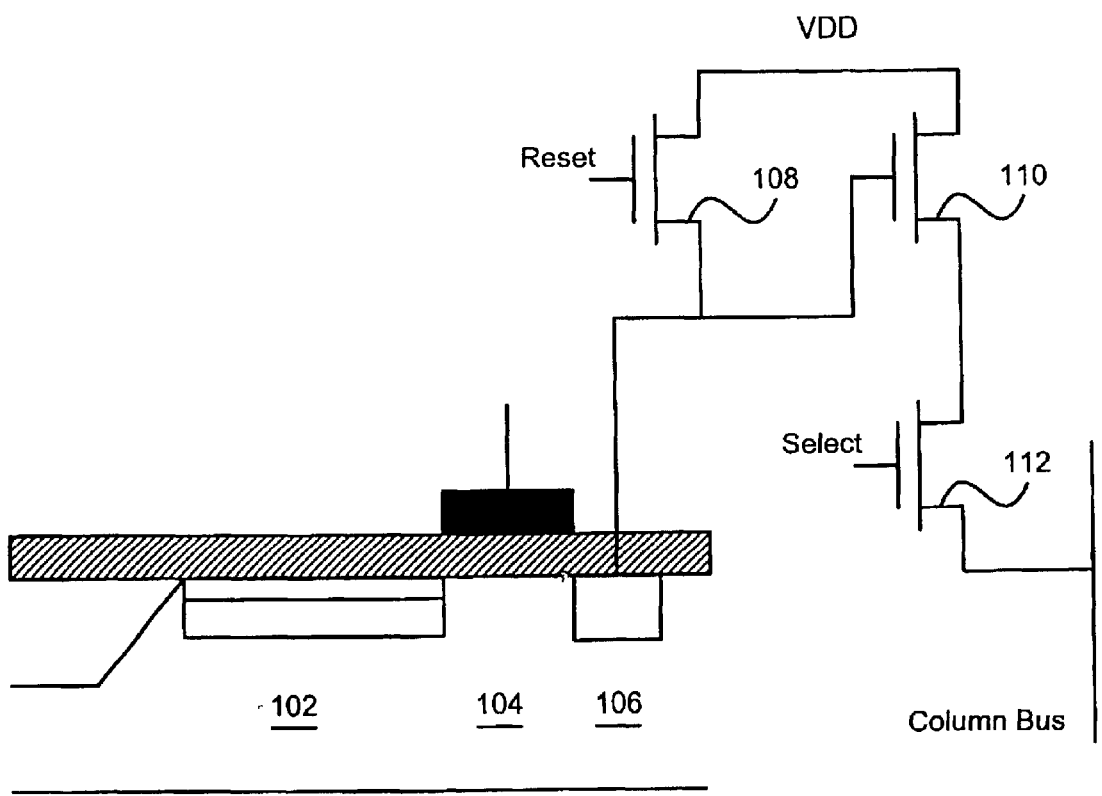
FIG. 1 shows an imager cell with control circuitry.

FIG. 1 presents a high level view of an imager cell 100. The imager cell 100 (descried in more detail below) includes a photoreceptor 102, a transfer gate 104, and a sense node 106. A reset transistor 108 is provided to reset the sense node 106. The source follower amplifier 110 buffers and amplifies the sense node 106 during readout to the column bus through the select transistor 112.

Figure 2:
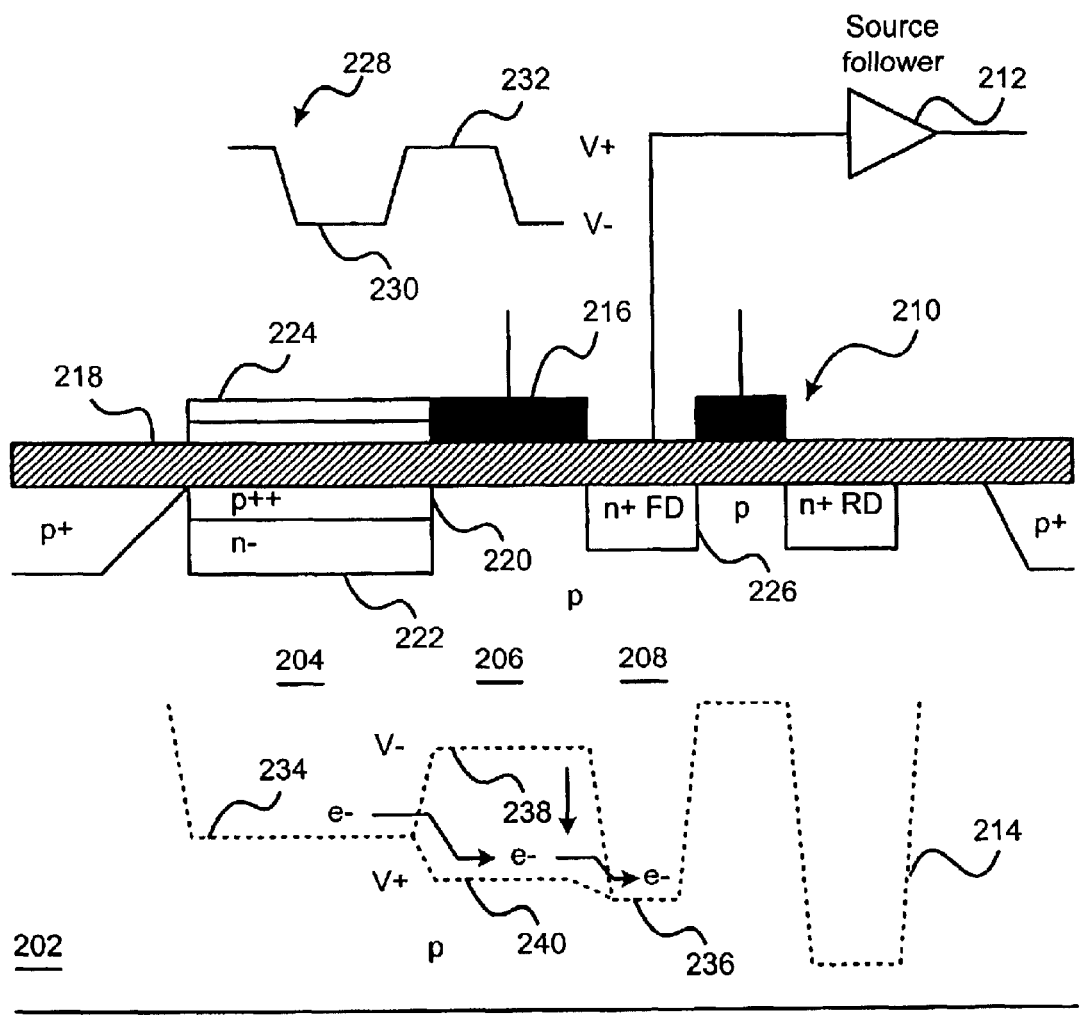
FIG. 2 shows an imager cell with a pinned photo region.

Turning next to FIG. 2, that figure presents a more detailed view of an imager cell 200. The imager cell 200 is formed in a p-type substrate 202 and includes a photoreceptor 204, transfer gate 206 and sense node 208. A reset transistor 210 provides a mechanism for approximately resetting the sense node 208 to an initial level, while the source follower output amplifier 212 provides sense node 208 output buffering and amplification. A potential well diagram 214 illustrates the variation in electric potential across the imager cell 200.

As shown in FIG. 2, the transfer gate 206 includes a photoreceptor readout gate 216, supporting gate oxide 218, and the p-type substrate 202. The photoreceptor 204 is formed as a photodiode including a pinned photo region 220 and an n– cathode region 222. The pinned photo region 220 is "pinned" because it is tied (or "pinned") to the potential of the substrate 202, typically ground or zero volts. Pinning the transfer generally suppresses dark current, which leads to an improved signal to noise ratio because fewer dark current electrons (i.e., noise electrons) contribute to the output signal. In addition, the photoreceptor 204 optionally includes an antireflective coating 224. The anti-reflective coating 224 may be formed, for example, from a 100 Angstrom layer of oxide and a 250 Angstrom layer of Silicon Nitride. The sense node 208 is formed from an n+ contact region 226 and p-type substrate 202.

In general, the p-doping may be accomplished using Boron while the n-doping may be accomplished using Phosphorus or Arsenic. The p++ doped pinned region 220 may also be formed by doping with Boron to a concentration level of approximately $5*10^{17}$ cm$^{-3}$ to $1*10^{18}$ cm$^{-3}$, in comparison with the background concentration of the wafers at approximately $6*10^{14}$ cm$^{-3}$. Note that the transfer gate 206 is disposed between the photoreceptor 204 and the sense node 208 in order to transfer charge between the photoreceptor 204 and the sense node 208. Note also that the transfer gate 206 includes a transistor gate structure (i.e., the photoreceptor readout gate 216). As explained in more detail below, the imager cell 200 sets up a potential well profile that allows charge to transfer through the transfer gate 206 depending on photoreceptor control clocks.

The operation of the imager cell 200 in low-light mode is now discussed with reference to the potential well diagram 214 and the photoreceptor control clock 228. Note that the photoreceptor control clock 228 varies between a V– level during an integration period 230 and a V+ level during a readout period 232. The duration of the integration period 230 and the readout period 232 vary in accordance with the desired operating speed of the imager cell 200.

The integration period 230 is determined in according to the time period needed for proper exposure in the camera system that incorporates the imager. The integration period may provide integration times between, as examples, 0.5 microseconds and several seconds.

The readout period 232 may be set in accordance with measurements showing how quickly charge transfers during readout in any given implementation of the imager cell 200. As one estimate, however, the readout period 232 may last 1 to 10 clock periods of a 20 megahertz clock, or, in other words, approximately 50 nanoseconds or more.

Either or both of the integration period 230 or readout period 232 may vary widely in accordance with programmable timing setup in the imager 300 and controller 302 (described below).

Note first that the photoreceptor 204 establishes the photoreceptor potential well 234 in the substrate 202 and that the sense node 208 establishes a sense node potential well 236 for ultimately holding the charge accumulated in the photoreceptor potential well 234. During the integration period 230, the integration voltage V– establishes the integration potential well 238 in the substrate 202. At this time, photons incident on the photoreceptor 202 produce electrons that are captured in the photoreceptor potential well 234 and constrained by the integration potential well 238.

During readout after the integration period 230, the readout voltage V+ establishes the readout potential well 240 in the substrate 202. At this time, electrons captured in the photoreceptor potential well 234 propagate through the transfer gate 206 to the sense node potential well 236. Under control of an imager cell readout clock (which turns on the select transistor 112), the source follower amplifier 212 then buffers and amplifies the sense node potential onto the column bus. After readout, the reset gate 210 activates under control of a sense node reset clock to approximately reset the sense node 208 to a known potential.

After charge is transferred to the sense node 208, charge then starts to again collect in the photoreceptor 204. Thus it is possible that the readout period 232 would be sufficiently long such that accumulating charge would spill over the transfer gate 206 into the sense node 208, causing sense node blooming. For that reason, a charge skim gate may optionally be connected to the photo region. When activated, the charge skim gate drains accumulating charge out of the photoreceptor 204 to prevent sense node blooming.

Figure 3:
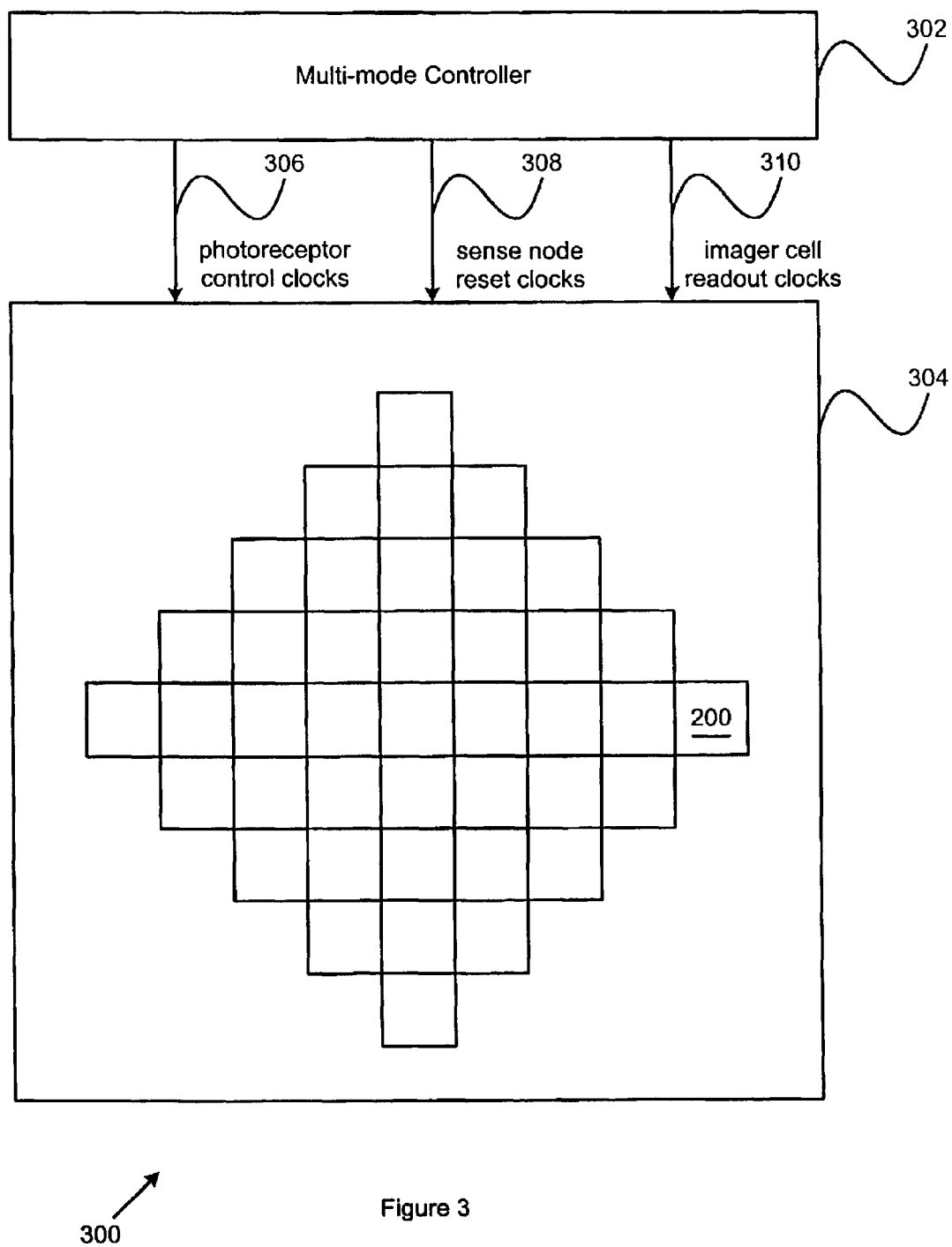
FIG. 3 illustrates an imager including a multi-mode controller and an array of photoreceptors.

Turning next to FIG. 3, that figure shows an imager 300 including a multi-mode controller 302 ("the controller 302") coupled to a photoreceptor array 304. The photoreceptor array 304 may be formed from imager cells 200 arranged in a predetermined pattern (which need not be square or rectangular). The controller 302 provides the photoreceptor control clocks 306, the sense node reset clocks 308, and the imager cell readout clocks 310. The controller 302 also provides several modes of operation, including a high mode, a low mode, and a Snap mode. Conventional digital circuitry may be used to implement the controller 302 according to the high-light, low-light, and Snap operational mode descriptions discussed below.

In particular, the controller 302 may by constructed using a full custom discrete logic design, a microcontroller core, or a separately packaged CPU executing instructions out of memory. Any implementation of the controller 302 may be integrated onto the same die as the photoreceptor array 304.

Typically, the controller 302 operates the imager 300 in the low-light mode. In the low-light mode, the controller 302 asserts the photoreceptor control clock 228 as noted above. In particular, the controller 302 asserts a photoreceptor control clock with an integration period 224 and a readout period 222. Thus, the photoreceptor potential well 234 provides the charge capacity to accumulate electrons produced by incident photons. The charge capacity is generally sufficient for imaging in low-light levels. In other words, the controller 302 selects the low-light mode when the controller 302 determines (or is explicitly commanded by an operator through input keys) that the measured, predicted, or modeled quantum efficiency and charge capacity of the photoreceptor potential well 234 will not be overwhelmed by electrons generated based on current lighting conditions.

After the integration period 230, the photoreceptor control clock 228 switches to a V+ readout voltage during the readout period 232. As a result, the readout potential well 240 is set up and electrons captured in the charge photoreceptor potential 234 propagate through the transfer gate 206 to the sense node 208. Subsequently, the controller 302 asserts the imager cell readout clock 310 to couple the sense node 208 through the source follower amplifier 212 and the select transistor 112 onto the column bus. External circuitry then produces a digital sample charge level in the sense node 208. After the external circuitry is finished reading the sense node 208, the controller 302 asserts the sense node reset clock 308 to approximately reset the sense node 208 to a known potential in preparation for the next readout cycle.

In certain instances, the controller 302 operates the imager 300 in the high-light mode. In the high-light mode, the controller 302 asserts the V+ voltage as the integration voltage during an integration period (rather than the V− voltage). As a result, the potential well existing in the substrate 202 during integration includes the charge photoreceptor potential well 234 (under the photoreceptor 204), the readout potential well 240 (under the transfer gate 206), and the sense node potential well 236 (under the sense node 208). In other words, in high-light mode, the readout potential well 240 and sense node potential well 236 are also used to accumulate charge generated by incident photons.

Note that in the low-light mode described above, the charge collection well existing in the substrate 202 during integration essentially corresponded to the photoreceptor potential well 234. In other words, during the low-light mode, the photoreceptor potential well 234 is constrained by the integration potential well 238 set up by the V− integration voltage.

Thus, in the high-light mode, a greater charge capacity exists in the substrate 202. As a result, when the controller 302 selects the high-light mode based on the measured, predicted, or modeled quantum efficiency and charge capacity of the photoreceptor potential well 234 (or when the controller 302 is explicitly commanded by an operator through input keys), the imager cell 200 provides a charge capacity that can capture an amount of electrons that might otherwise overwhelm the low-light photoreceptor potential well 234 as constrained by the integration potential well 238.

In high-light mode, the controller 302 performs readout in the same manner as noted above with respect to the low-light mode. In particular, after the integration period, the controller 302 asserts the imager cell readout clock 310 to couple the sense node 208 through the source follower amplifier 212 and the select transistor 112 onto the column bus. External circuitry then produces a digital sample charge level in the sense node 208. After the external circuitry is finished reading the sense node 208, the controller 302 asserts the sense node reset clock 308 to approximately reset the sense node 208 to a known potential.

Note that during high-light mode as the integration voltage V+ increases, so does the depth of the potential well 240, and thus so does the overall charge capacity level for the photoreceptor 202. As a result, during conditions of bright light, for example, the controller 302 may increase the integration voltage V+ to enhance the charge collection capacity level in the photoreceptor 202 (and thereby reduce blooming or washout, as examples). To that end, the controller 302 may be preprogrammed with a selection of V+ integration voltages to apply, during high-light mode, to the photoreceptor readout gate 216, as selected by external input, or in coordination with measurements received from external light sensors or the like.

As noted above, the imager cell 200 may also operate in what is referred to as a "Snap" mode in conjunction with the low-light mode. In the Snap mode, the controller 302 asserts the V+ readout voltage 232 of the photoreceptor control clocks 306 for multiple imager cells 200 simultaneously. The result is that the charge collected in a set of photoreceptors 200 is simultaneously transferred into the sense nodes 208 of each respective photoreceptor 204. The Snap mode thus provides a snapshot at an instant in time of the charge collected in the set of photoreceptors 200 to obtain image information undisturbed by noise arising during, for example, a sequential readout process.

As an example, numerous imager cells 200 may be organized into an array to form a CMOS imager. The controller 302 may then select two or more imager cells 200 as a set of photoreceptors 200 for the next Snap operation. As examples, the set may include all the photoreceptors 200 that form a rectangular sub-array in the center of the CMOS imager, a stripe of predetermined width vertically through the center of the CMOS imager, or every other imager cell 200 in the CMOS imager.

Figure 4:
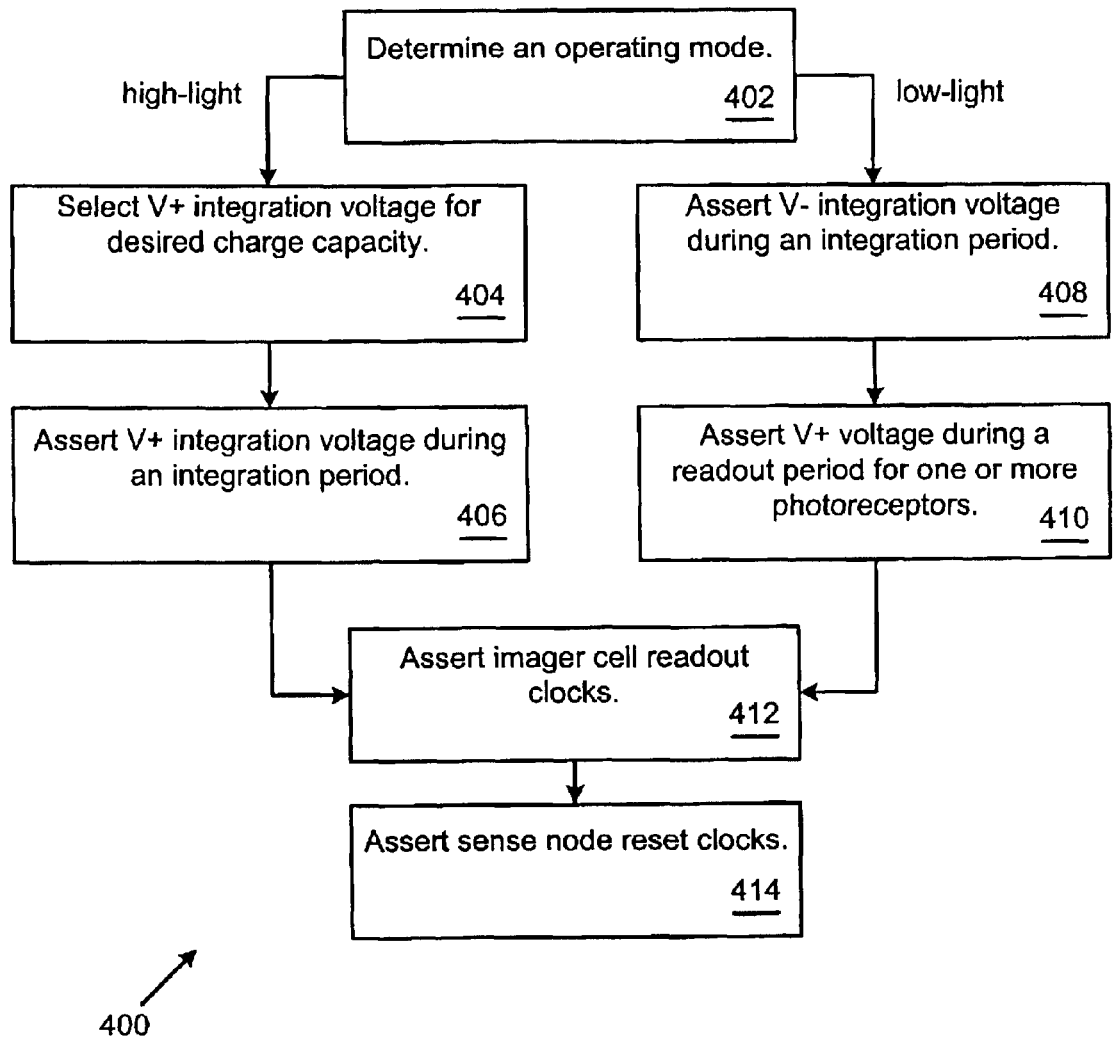
FIG. 4 depicts a method of controlling an imager.

Turning next to FIG. 4, that figure illustrates a flow diagram of a method for controlling an imager. Initially, the controller 302 determines (302) an operating mode. For example, the controller may select either a high-light or a low-light operating mode based on external light sensors, operator input, and the like. In high-light mode, the controller 302 selects (404) a V+ integration voltage to setup a desired charge capacity level in the substrate 202. As noted above, the integration voltage V+ may be increased to increase the charge capacity, for example, by selecting between one or more preset integration voltage options in the controller 302. After the controller 302 selects the V+ integration voltage, the controller 302 asserts (406) the V+ integration voltage during an integration period to accumulate electrons generated by incident photons.

On the other hand, in the low-light mode, the controller 302 asserts (408) a V− integration voltage during an integration period. Electrons generated by incident photons are then collected in the photoreceptor potential well 234. In optional conjunction with Snap mode operation, the controller 302 then asserts (410) a V+ readout voltage to a set of photoreceptors 200. Captured charge is thereby simultaneously transferred to the sense nodes 208 associated with each photoreceptor 204 that is part of the Snap operation. It is noted that it is not necessary to use the Snap mode, however. In other words, conventional photoreceptor array readout techniques are also suitable.

The controller 302, in both high-light mode and low-light mode then proceeds to assert (412) imager cell readout clocks to the access transistors 112. As a result, the sense nodes 208 are amplified and buffered by the source follower amplifiers 212 through the access transistors 112 onto the column bus. After readout, the controller 302 then asserts (414) the sense node reset clocks to return the sense nodes 208 approximately to a known potential.

In this manner, the imager provides enhanced performance light sensors using a multi-mode controller. The Snap mode provides a snapshot at an instant in time of the charge collected in a set of photoreceptors to obtain image information undisturbed by noise. The high and low modes provide a selective charge capacity to accommodate wide variations in light level. The selectivity in integration voltage in high-light mode also provides a configuration charge capacity for the photoreceptors.

While various embodiments of the application have been described, it will be apparent to those of ordinary skill in the art that many more embodiments and implementations (e.g., using a different form or representation of quantization of the photoreceptor noise range) are possible that are within the scope of this invention. Accordingly, the invention is not to be restricted except in light of the attached claims and their equivalents.

What is claimed is:

1. An imager comprising:
   a plurality of imager cells each comprising a photoreceptor establishing a photoreceptor potential well, a transfer gate establishing a readout potential well, and a sense node; and
   a multi-mode controller coupled to the plurality of imager cells, the multi-mode controller comprising circuitry implementing at least one of a high-light mode of operation providing charge accumulation in the photoreceptor potential well and the readout potential well, and a Snap mode of operation simultaneously activating a plurality of the transfer gates to initiate readout of a plurality of the imager cells;

the multi-mode controller further comprises circuitry for implementing a low-light mode providing charge accumulation in the photoreceptor potential well that is constrained by an integration potential well established by the transfer gate during an integration period.

2. The imager of claim 1, wherein the high-light mode provides charge accumulation in the photoreceptor potential well, the readout potential well, and a sense node potential well established by the sense node.

3. The image of claim 1, wherein at least one of the imager cells further comprises an anti-reflective coating.

4. The imager of claim 1, wherein at least one of the imager cells comprises a pinned photoreceptor.

5. The imager of claim 4, wherein the pinned photoreceptor further comprises a charge skim gate coupled to the photoreceptor.

6. The imager of claim 1, wherein each imager cell further comprises a photoreceptor readout gate above the transfer gate.

7. The imager of claim 6, wherein the high-light mode comprises applying a V+ integration voltage during an integration period to at least one of the photoreceptor readout gates, thereby allowing charge to accumulate in at least one readout potential well.

8. The imager of claim 7, wherein the V+ integration voltage varies in accordance with a predetermined desired charge capacity for the imager cells.

9. An imager comprising:
   an imager cell comprising a photoreceptor establishing a photoreceptor potential well, a transfer gate establishing a readout potential well and an integration potential well, and a sense node; and
   a multi-mode controller coupled to the imager cell, the multi-mode controller comprising circuitry implementing a high-light mode of operation providing charge accumulation in the photoreceptor potential well and the readout potential well, and a low-light mode operation providing charge accumulation in the photoreceptor potential well and constrained by the integration potential well.

10. The imager of claim 9, wherein the high-light mode of operation provides charge accumulation in the photoreceptor potential well, the readout potential well, and a sense node potential well established by the sense node.

11. The imager of claim 9, further comprising an anti-reflective coating disposed above the photoreceptor.

12. The imager of claim 9, wherein the photoreceptor is a pinned photoreceptor comprising a p++ semiconductor region adjacent to an n-semiconductor region.

13. The imager of claim 9, further comprising a charge skim gate coupled to the photoreceptor.

14. A method for operating an imager cell, the method comprising:
   selecting between a low-light operating mode and a high-light operating mode for an imager cell comprising a photoreceptor, a transfer gate, and a sense node;
   when operating in the high-light operating mode, establishing a readout potential well in the transfer gate and collecting electrons in a photoreceptor potential well and the readout potential well; and
   when operating in the low-light operating mode, constraining the photoreceptor potential well with an integration potential well in the transfer gate and collecting electrons in the photoreceptor potential well.

15. The method of claim 14, further comprising the step of, when operating in the high-light operating mode, collecting electrons in a sense node potential well established by the sense node.

16. The method of claim 14, wherein the step of establishing a readout potential well comprises the step of selecting one of a plurality of available V+ integration voltages and applying the selected V+ integration voltage to the transfer gate.

17. The method of claim 14, further comprising the step of, when operating in the low-light operating mode, applying a V− integration voltage to the transfer gate during an integration period and applying a V+ readout voltage to the transfer gate during a readout period.

18. The method of claim 15, further comprising the step of sensing the collected electrons at a sense node.

19. The method of claim 18, further comprising the step of activating a charge skim gate to prevent sense node blooming.

20. An imager comprising:
   a plurality of imager cells each comprising a photoreceptor establishing a photoreceptor potential well, a transfer gate establishing a readout potential well, and a sense node; and
   a controller coupled to the plurality of imager cells, the controller comprising circuitry implementing at least one of a high-light mode of operation providing charge accumulation in the photoreceptor potential well and the readout potential well, and a Snap mode of operation simultaneously activating a plurality of the transfer gates to initiate readout of a plurality of the imager cells;
   wherein each imager cell further comprises a photoreceptor readout gate above the transfer gate.

21. An imager comprising:
   a plurality of imager cells each comprising a photoreceptor establishing a photoreceptor potential well, a transfer gate establishing a readout potential well, and a sense node; and
   a controller coupled to the plurality of imager cells, the controller comprising circuitry implementing at least one of a high-light mode of operation providing charge accumulation in the photoreceptor potential well and the readout potential well, and a Snap mode of operation simultaneously activating a plurality of the transfer gates to initiate readout of a plurality of the imager cells;
   wherein the high-light mode comprises applying a V+ integration voltage during an integration period to at least one of the photoreceptor readout gates, thereby allowing charge to accumulate in at least one readout potential well; and wherein the V+ integration voltage varies in accordance with a predetermined desired charge capacity for the imager cells.

* * * * *